United States Patent
Hsieh et al.

(10) Patent No.: US 10,833,631 B2
(45) Date of Patent: Nov. 10, 2020

(54) AMPLIFIER BANDWIDTH CALIBRATION OF CONTINUOUS TIME CIRCUIT

(71) Applicant: MEDIATEK INC., Hsin-Chu (TW)

(72) Inventors: Hung-Yi Hsieh, Hsinchu (TW); Jui-Yuan Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 4 days.

(21) Appl. No.: 16/199,245

(22) Filed: Nov. 26, 2018

(65) Prior Publication Data
US 2019/0238093 A1 Aug. 1, 2019

Related U.S. Application Data

(60) Provisional application No. 62/622,235, filed on Jan. 26, 2018.

(51) Int. Cl.
| | | |
|---|---|---|
| *H03F 1/34* | (2006.01) | |
| *H03B 5/12* | (2006.01) | |
| *H03F 1/02* | (2006.01) | |
| *H03B 5/20* | (2006.01) | |
| *H03F 3/45* | (2006.01) | |

(52) U.S. Cl.
CPC ........... *H03B 5/124* (2013.01); *H03B 5/1206* (2013.01); *H03B 5/20* (2013.01); *H03F 1/0205* (2013.01); *H03F 1/34* (2013.01); *H03F 3/45475* (2013.01); *H03F 2203/45048* (2013.01); *H03F 2203/45526* (2013.01)

(58) Field of Classification Search
CPC ........................................................ H03F 1/34
USPC ..................................................... 330/86, 109
See application file for complete search history.

(56) References Cited

U.S. PATENT DOCUMENTS

| | | | |
|---|---|---|---|
| 5,625,316 A | 4/1997 | Chambers et al. | |
| 6,262,603 B1* | 7/2001 | Mohan | H03B 5/20 327/518 |
| 6,417,727 B1 | 7/2002 | Davis | |
| 6,608,527 B2 | 8/2003 | Moloudi et al. | |
| 6,803,813 B1 | 10/2004 | Pham | |
| 6,842,710 B1 | 1/2005 | Gehring et al. | |
| 6,968,019 B2* | 11/2005 | Darabi | H04L 25/062 375/316 |
| 7,064,557 B2 | 6/2006 | Pan et al. | |
| 7,248,124 B2 | 7/2007 | McCorquodale et al. | |
| 7,307,486 B2 | 12/2007 | Pernia et al. | |
| 7,352,249 B2* | 4/2008 | Balboni | H03C 3/0925 327/157 |
| 7,365,614 B2 | 4/2008 | McCorquodale et al. | |
| 7,504,899 B2 | 3/2009 | McCorquodale et al. | |
| 7,548,125 B2 | 6/2009 | Carichner et al. | |
| 7,656,244 B2 | 2/2010 | McCorquodale et al. | |
| 7,692,484 B2* | 4/2010 | Terryn | H03F 1/08 327/552 |
| 8,073,080 B2 | 12/2011 | Li et al. | |

(Continued)

*Primary Examiner* — Henry Choe
(74) *Attorney, Agent, or Firm* — Winston Hsu

(57) ABSTRACT

The present invention provides a continuous time circuit including an amplifier and a RC calibration circuit. In the operations of the continuous time circuit, the amplifier is configured to amplify an input signal to generate an output signal, and the RC calibration circuit is configured to adjust a capacitance of a compensation capacitor of the amplifier according to a RC product measurement result.

19 Claims, 9 Drawing Sheets

(56) References Cited

U.S. PATENT DOCUMENTS

| | | | |
|---|---|---|---|
| 8,552,797 B2* | 10/2013 | Lin | H03H 7/0153 327/552 |
| 2005/0073369 A1* | 4/2005 | Balboni | H03C 3/0925 331/16 |
| 2005/0118980 A1 | 6/2005 | Pai et al. | |
| 2009/0108858 A1* | 4/2009 | Kao | H03H 7/0161 324/750.01 |

* cited by examiner

US 10,833,631 B2

AMPLIFIER BANDWIDTH CALIBRATION OF CONTINUOUS TIME CIRCUIT

CROSS REFERENCE TO RELATED APPLICATIONS

This application claims the priority of U.S. Provisional Application No. 62/622,235, filed on Jan. 26, 2018, which is included herein by reference in its entirety.

BACKGROUND

In order to pass a bandwidth specification of a continuous time circuit such as an amplifier in a worst corner of a semiconductor process, designers usually overdesign the bandwidth to guarantee that the amplifier functions well. However, overdesigns may increase the chip area and cause larger power consumption when the amplifier is in a better corner. Therefore, how to provide an effective calibration method for the amplifier bandwidth according to process, voltage, temperature (PVT) variation effects to avoid the overdesign requirements is an importance topic.

SUMMARY

It is therefore an objective of the present invention to provide a continuous time circuit whose compensation capacitor can be calibrated according to a RC product measurement result, to solve the above-mentioned problems.

According to one embodiment of the present invention, a continuous time circuit comprising an amplifier and a RC calibration circuit is provided. In the operations of the continuous time circuit, the amplifier is configured to amplify an input signal to generate an output signal, and the RC calibration circuit is configured to adjust a capacitance of a compensation capacitor of the amplifier according to a RC product measurement result.

According to another embodiment of the present invention, a method for calibrating a continuous time circuit is provided, wherein the continuous time circuit comprises an amplifier, and the method comprises the steps of: adjusting a capacitance of a compensation capacitor of the amplifier according to a RC product measurement result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
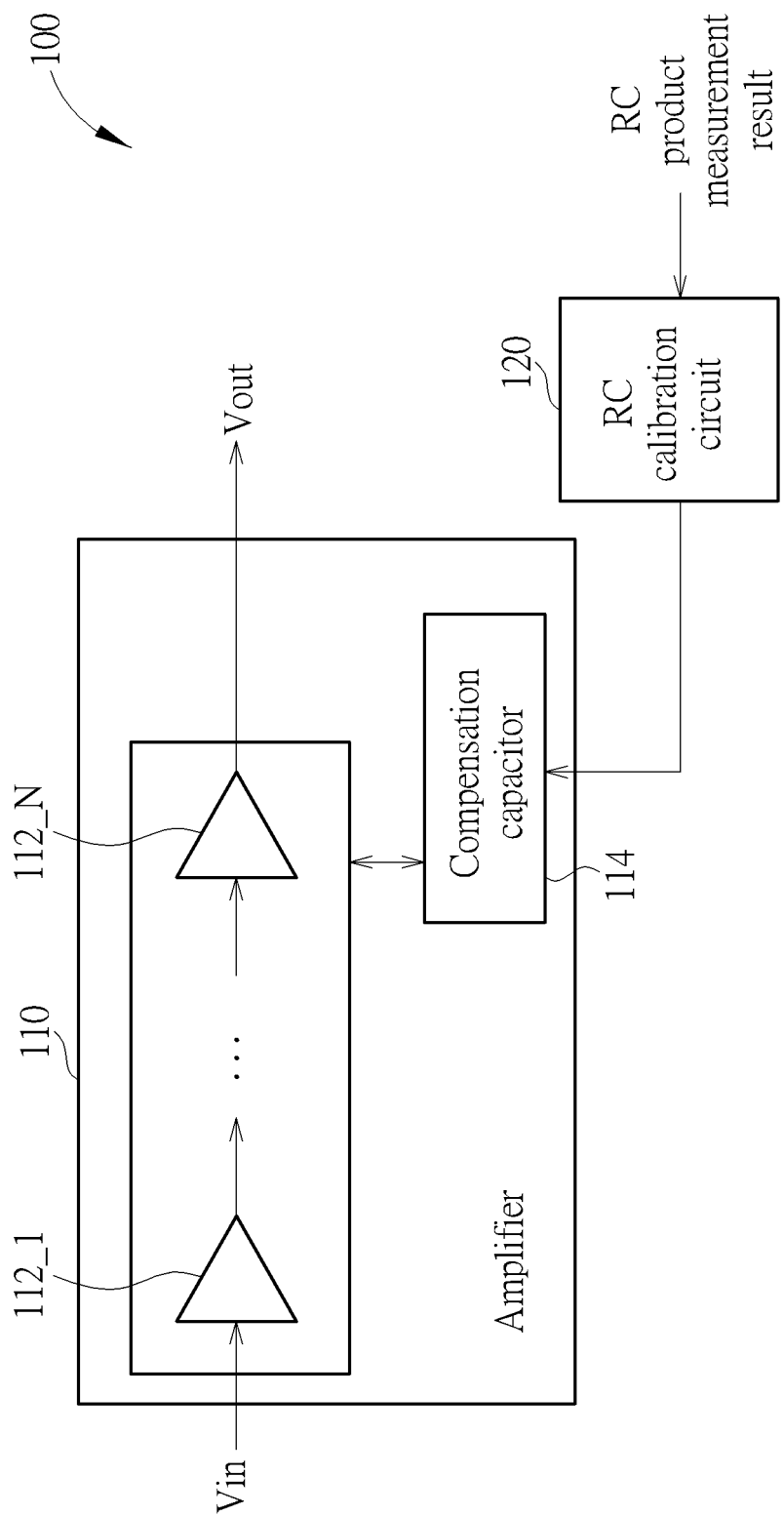
FIG. 1 is a diagram illustrating a continuous time circuit according to a first embodiment of the present invention.

FIG. 1 is a diagram illustrating a continuous time circuit 100 according to a first embodiment of the present invention. As shown in FIG. 1, the continuous time circuit 100 comprises an amplifier 110 and a resistance-capacitance (RC) calibration circuit 120, wherein the amplifier 110 comprises a plurality of amplifying stages 112_1-112_N and a compensation capacitor 114. In this embodiment, the compensation capacitor 114 is a variable capacitor, and the compensation capacitor 114 is used to make the amplifier 110 have a desired stability margin but it will also affect the amplifier's bandwidth.

In the operations of the continuous time circuit 100, the amplifying stages 112_1-112N amplify an input signal Vin to generate an output signal Vout, where the bandwidth of the amplifier 110 is proportional to (1/RC) in the equivalent circuit of the amplifier 110, where C is proportional to a capacitance of the compensation capacitor 114, and R is proportional to a bias current of the amplifier 110. Because the RC production of the amplifier 110 may be varied due to the PVT variations, the RC calibration circuit 120 is configured to adjust the compensation capacitor 114 to make the bandwidth of the amplifier 110 be a constant. In this embodiment, RC calibration circuit 120 receives an RC product measurement result which indicates a measurement result of an RC product or a RC product variation to adjust the compensation capacitor 114, wherein the RC product can be generated by any suitable measurement circuit. For example, if the RC product measurement result indicates that the RC product is greater than a desired value, it means that the bandwidth of the amplifier 110 is decreased due to the greater RC product, so the RC calibration circuit 120 lowers the compensation capacitor 114 to make the RC product of the amplifier 110 meet the desired value. Similarly, if the RC product measurement result indicates that the RC product is less than a desired value, it means that the bandwidth of the amplifier 110 is increased due to the less RC product, so the RC calibration circuit 120 increases the compensation capacitor 114 to make the RC product of the amplifier 110 meet the desired value.

In this embodiment, the operations of the RC calibration circuit 120 is based on the RC product measurement result such as the RC product or the RC product variation, instead of a resistance value, resistance variation, a capacitance or a capacitance variation. The RC product measurement result may be generated by a measurement circuit using a frequency offset of an oscillation signal. For example, the measurement circuit may use internal circuits having resistor (s) and capacitor(s) to generate an oscillation signal whose frequency is related to the RC product, and the measurement circuit compares the frequency of the oscillation signal with a desired absolute frequency to generate a comparison result, where the comparison result can serve as the RC product measurement result indicating the RC product or the RC product variation of the measurement circuit. In addition, because the measurement circuit and the amplifier 110 are in the same chip or close to each other, the RC product measurement result of the measurement circuit can serve as the RC product measurement result of the amplifier 110.

In addition, in the advanced semiconductor process, the switchable capacitor array (i.e. variable capacitor) has less chip area than the switchable resistor array (i.e. variable resistor). Therefore, in order to save the chip area of the continuous time circuit 100, only the compensation capacitor 114 is used to fine tune the bandwidth, and the amplifier 110 does not have any variable resistor for determining the bandwidth of the amplifier 110.

Figure 2:
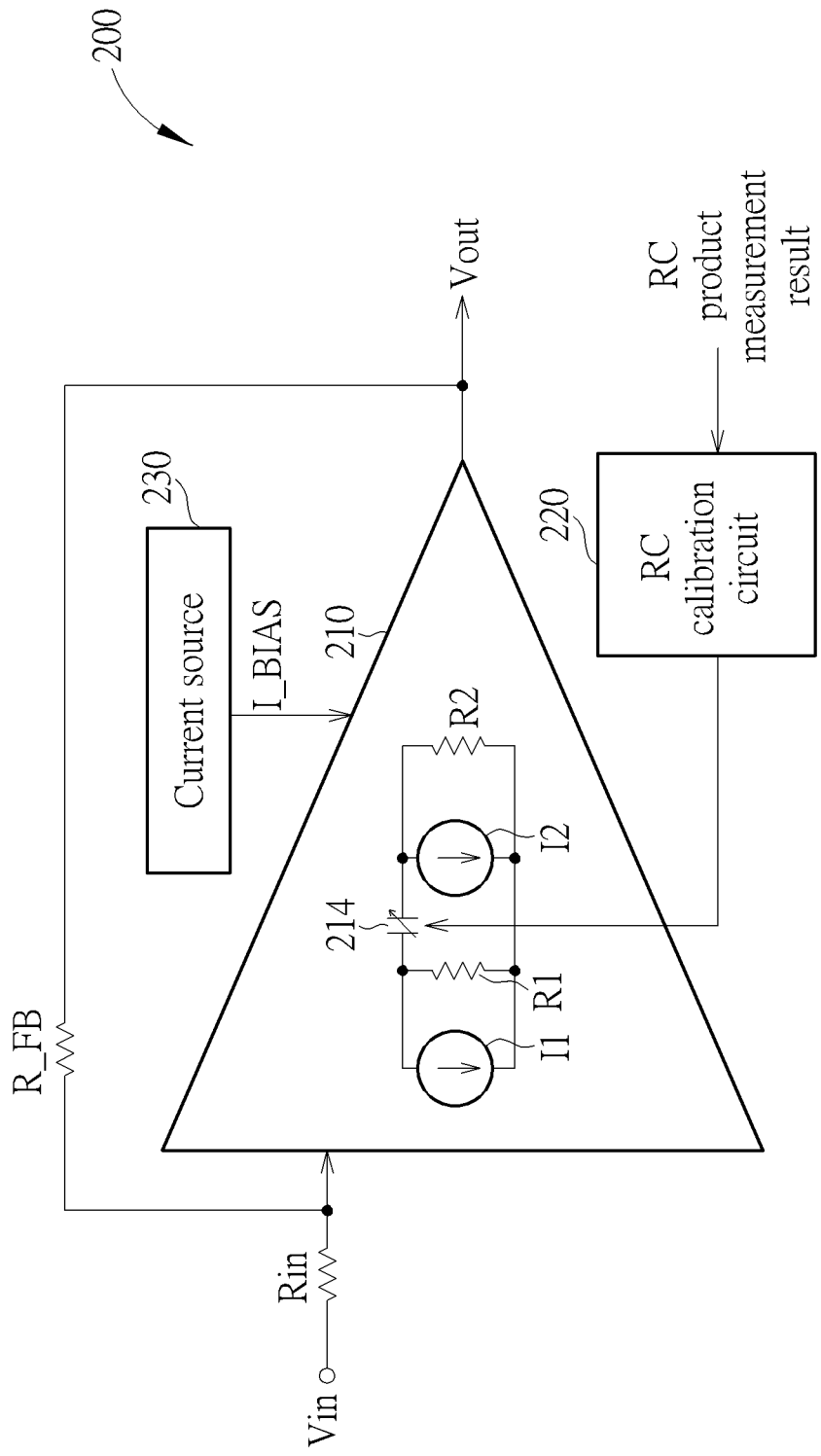
FIG. 2 is a diagram illustrating a continuous time circuit according to a second embodiment of the present invention.
Figure 9:
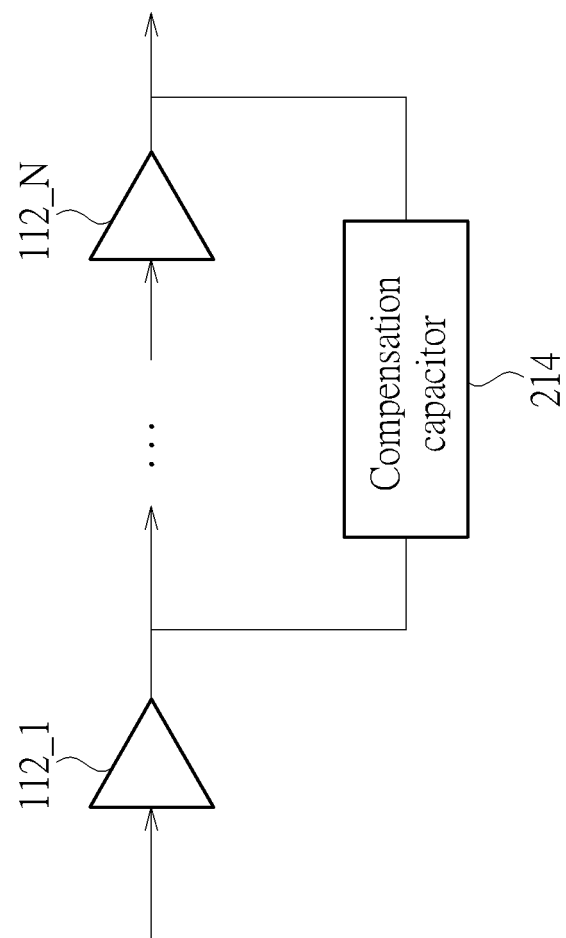
FIG. 9 shows that the compensation capacitor is positioned between output terminals of two amplifying stages of the amplifier.

FIG. 2 is a diagram illustrating a continuous time circuit 200 according to a second embodiment of the present invention. As shown in FIG. 2, the continuous time circuit 200 comprises an amplifier 210 with an input resistor Rin and a feedback resistor R_FB, a RC calibration circuit 220 and a current source 230, wherein the amplifier 210 comprises a compensation capacitor 214. In this embodiment, the amplifier 210 comprises a plurality of amplifying stages (FIG. 2 shows the equivalent circuits: current sources I1 and I2 and resistors R1 and R2), the compensation capacitor 214 is a variable capacitor coupled between output terminals of two amplifying stages (e.g. the compensation capacitor 214 may be positioned between the amplifying stages 112_1 and 112_N shown in FIG. 1, as shown in FIG. 9), and the compensation capacitor 214 is used to make the amplifier 210 have a desired bandwidth.

In the operations of the continuous time circuit 200, the amplifier 210 amplifies an input signal Vin to generate an output signal Vout, where the bandwidth of the amplifier 210 is proportional to (1/RC) in the equivalent circuit of the amplifier 210. Because the RC production of the amplifier 210 may be varied due to the PVT variations, the RC calibration circuit 220 is configured to adjust the compensation capacitor 214 to make the bandwidth of the amplifier 210 be a constant. In this embodiment, RC calibration circuit 220 receives a RC product measurement result to adjust the compensation capacitor 214. For example, if the RC product measurement result indicates that the RC product is greater than a desired value, it means that the bandwidth of the amplifier 210 is decreased due to the greater RC product, so the RC calibration circuit 220 lowers the compensation capacitor 214 to make the RC product of the amplifier 210 meet the desired value. Similarly, if the RC product measurement result indicates that the RC product is less than a desired value, it means that the bandwidth of the amplifier 210 is increased due to the less RC product, so the RC calibration circuit 220 increases the compensation capacitor 214 to make the RC product of the amplifier 210 meet the desired value.

Figure 3:
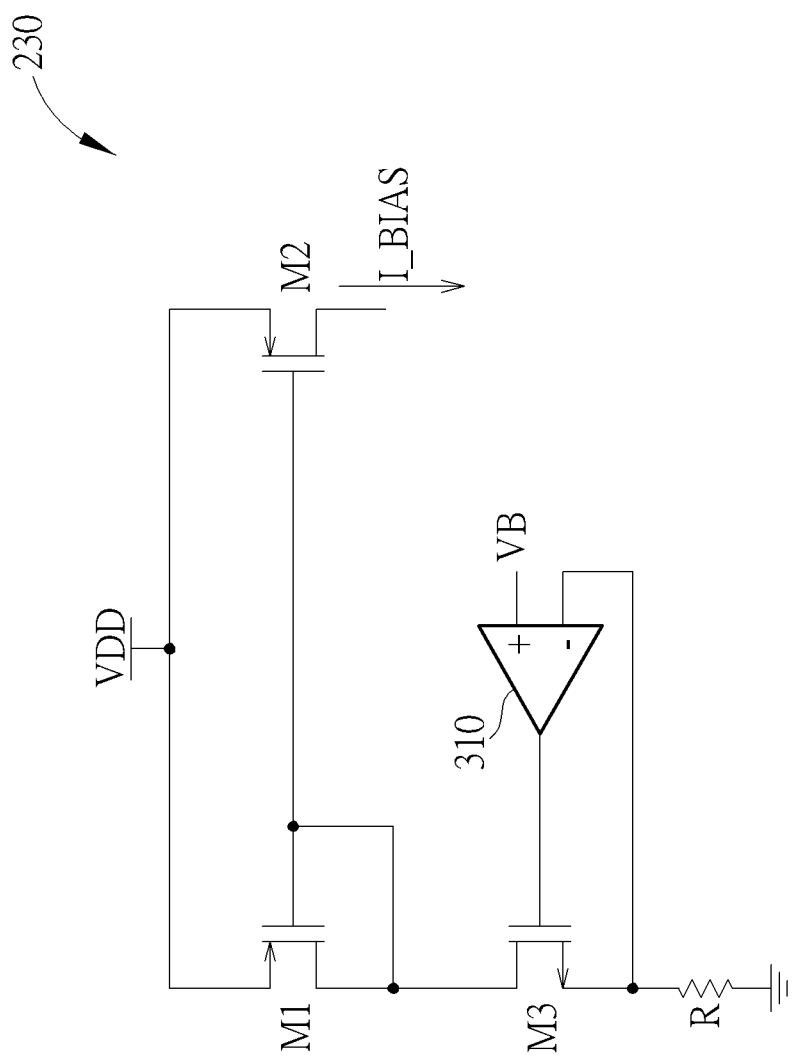
FIG. 3 is a diagram illustrating a current source shown in FIG. 2 according to one embodiment of the present invention.

FIG. 3 is a diagram illustrating the current source 230 according to one embodiment of the present invention. As shown in FIG. 3, the current 230 comprises transistors M1, M2 and M3, an operational amplifier 310 and a resistor R, wherein a positive terminal of the operational amplifier 310 is coupled to a bias voltage VB, and a negative terminal of the operational amplifier 310 is coupled to a source electrode of the transistor M3. In the current source 230, a current flowing through the transistors M1 and M3 is equal to (VB/R), and the transistors M2 and M3 form a current mirror to generate a bias current I_BIAS that is proportional to (VB/R).

In this embodiment, the bias current I_BIAS is proportional to (VB/R), the transconductance of the amplifier is proportional to (I_BIAS/VT) if the transistors within the amplifier 210 are in weak inversion regions, the bandwidth of amplifier 210 is proportional to (gm/C), so the bandwidth of amplifier 210 is proportional to (VB/(R*C*VT)), where VT is a thermal voltage, gm is the transconductance of the amplifier 210, and C is the equivalent capacitance of the amplifier 210. Therefore, by using the RC calibration circuit 220 to adjust the compensation capacitor 214 to make the RC product of the amplifier 210 meet the desired value, the bandwidth of amplifier 210 can be a constant, and the overdesigns are not needed for the bandwidth.

In addition, in order to save the chip area of the continuous time circuit 200, only the compensation capacitor 214 is used to fine tune the bandwidth, and the amplifier 210 and the current source 230 do not have any variable resistor for adjusting/determining the bandwidth of the amplifier 210.

Figure 4:
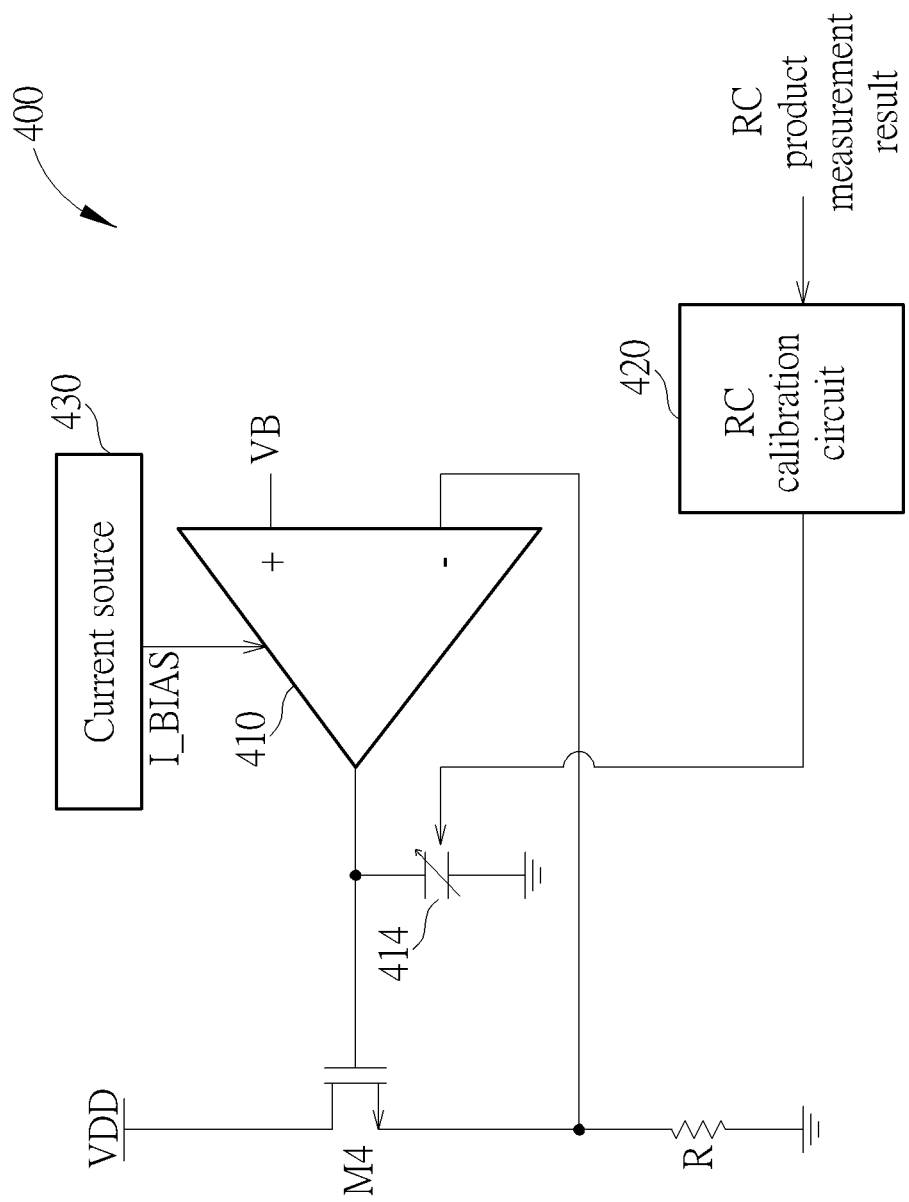
FIG. 4 is a diagram illustrating a continuous time circuit according to a third embodiment of the present invention.

FIG. 4 is a diagram illustrating a continuous time circuit 400 according to a third embodiment of the present invention. As shown in FIG. 4, the continuous time circuit 400 is a low-dropout regulator (LDO) comprising an amplifier 410, a RC calibration circuit 420, a current source 430, a compensation capacitor 414, a transistor M4 and a resistor R3. In this embodiment, the compensation capacitor 414 is coupled between an output terminal of the amplifier 410 and a ground voltage, a gate electrode of the transistor M4 is coupled to the output terminal of the amplifier 410, a drain electrode of the transistor M4 is coupled to a supply voltage VDD, and a source electrode of the transistor M4 is coupled to the ground voltage via the resistor R3. In this embodiment, the compensation capacitor 414 is a variable capacitor, and the compensation capacitor 414 is used to make the amplifier 410 have a desired bandwidth.

In the operations of the continuous time circuit 400, the RC calibration circuit 420 is configured to adjust the compensation capacitor 414 to make the bandwidth of the amplifier 410 be a constant. In this embodiment, RC calibration circuit 420 receives a RC product measurement result to adjust the compensation capacitor 414. For example, if the RC product measurement result indicates that the RC product is greater than a desired value, it means that the bandwidth of the amplifier 410 is decreased due to the greater RC product, so the RC calibration circuit 420 lowers the compensation capacitor 414 to make the RC product of the amplifier 410 meet the desired value. Similarly, if the RC product measurement result indicates that the RC product is less than a desired value, it means that the bandwidth of the amplifier 410 is increased due to the less RC product, so the RC calibration circuit 420 increases the compensation capacitor 414 to make the RC product of the amplifier 410 meet the desired value.

Figure 5:
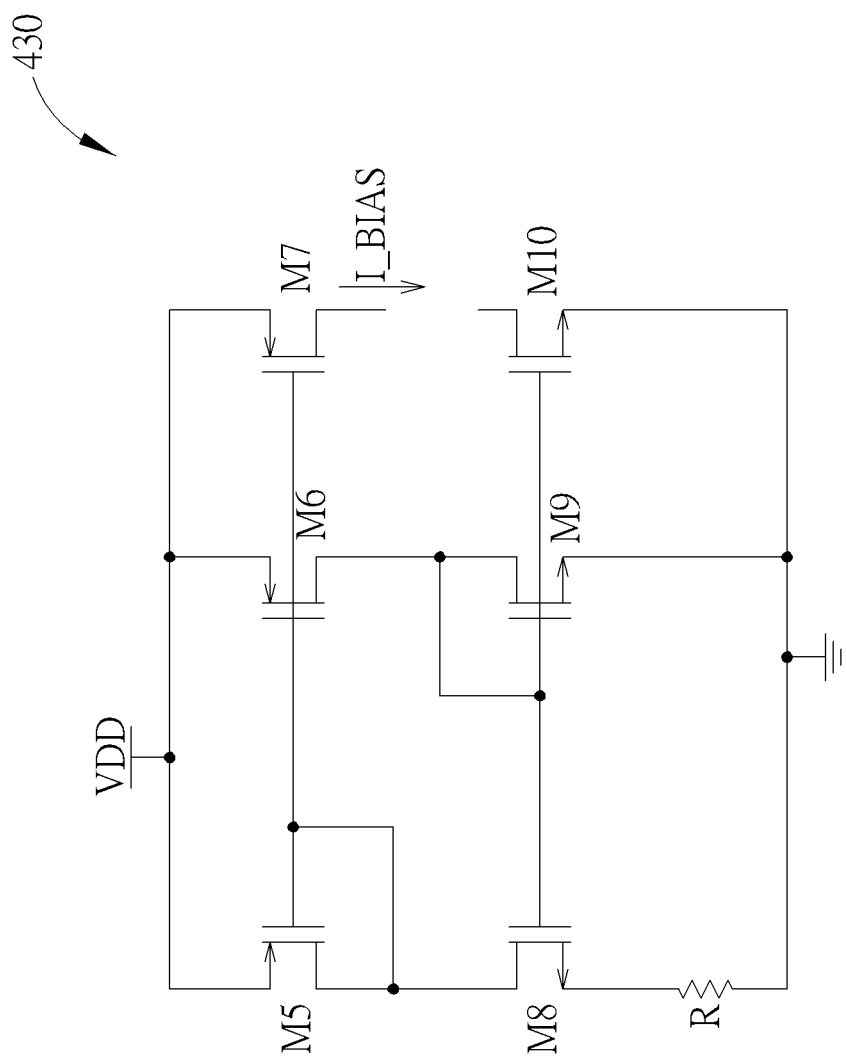
FIG. 5 is a diagram illustrating a current source shown in FIG. 4 according to one embodiment of the present invention.

FIG. 5 is a diagram illustrating the current source 430 according to one embodiment of the present invention. As shown in FIG. 5, the current source 430 is a Widlar current source comprising transistors M5, M6, M7, M8, M9 and M10 and a resistor R. In the current source 430, a bias current I_BIAS is proportional to (VT/R), where VT is the thermal voltage.

In this embodiment, the bias current I_BIAS is proportional to (VT/R), the transconductance of the amplifier 410 is proportional to (I_BIAS/VT) if the transistors within the amplifier 410 are in weak inversion regions, the bandwidth of amplifier 410 is proportional to (gm/C), so the bandwidth of amplifier 410 is proportional to (1/R*C) Therefore, by using the RC calibration circuit 420 to adjust the compensation capacitor 414 to make the RC product of the amplifier 410 meet the desired value, the bandwidth of the amplifier 410 can be a constant, and the overdesigns are not needed for the bandwidth.

In this embodiment, in order to save the chip area of the continuous time circuit 400, only the compensation capacitor 414 is used to fine tune the bandwidth, and the amplifier 410 and the current source 430 do not have any variable resistor for adjusting/determining the bandwidth of the amplifier 410.

Figure 6:
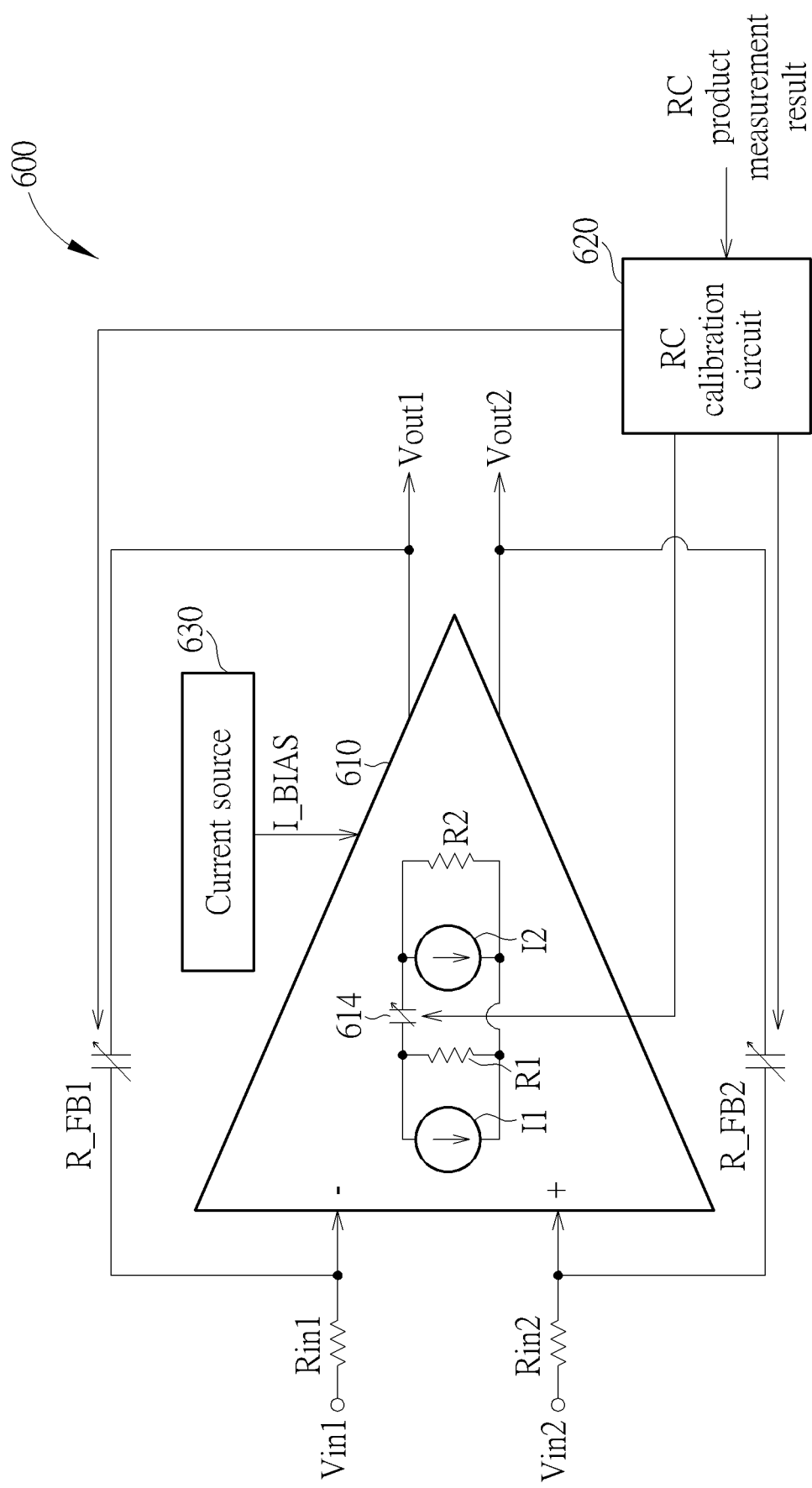
FIG. 6 is a diagram illustrating a continuous time circuit according to a fourth embodiment of the present invention.

FIG. 6 is a diagram illustrating a continuous time circuit 600 according to a fourth embodiment of the present invention. As shown in FIG. 6, the continuous time circuit 600 is an active filter comprising an amplifier 610 with input resistor Rin1 and Rin2 and feedback capacitors C_FB1 and C_FB2, a RC calibration circuit 620 and a current source 630, wherein the amplifier 610 comprises a compensation capacitor 614. In this embodiment, the amplifier 610 comprises a plurality of amplifying stages (FIG. 6 shows the equivalent circuits comprising current sources I1 and I2 and resistors R1 and R2), the compensation capacitor 614 is a variable capacitor coupled between output terminals of two amplifying stages, and the compensation capacitor 614 is used to make the amplifier 610 have a desired bandwidth.

In the operations of the continuous time circuit 600, the amplifier 610 amplifies input signals Vin1 and Vin2 to generate output signals Vout1 and Vout2. In this embodiment, RC calibration circuit 620 receives a RC product measurement result to adjust the compensation capacitor 614. For example, if the RC product measurement result indicates that the RC product is greater than a desired value, it means that the bandwidth of the amplifier 610 is decreased due to the greater RC product, so the RC calibration circuit 620 lowers the compensation capacitor 614 and the feedback capacitors C_FB1 and C_FB2 to make the bandwidth of the amplifier 610 meet the desired value. Similarly, if the RC product measurement result indicates that the RC product is less than a desired value, it means that the bandwidth of the amplifier 610 is increased due to the less RC product, so the RC calibration circuit 620 increases the compensation capacitor 614 and the feedback capacitors C_FB1 and C_FB2 to make the bandwidth of the amplifier 610 meet the desired value.

Figure 7:
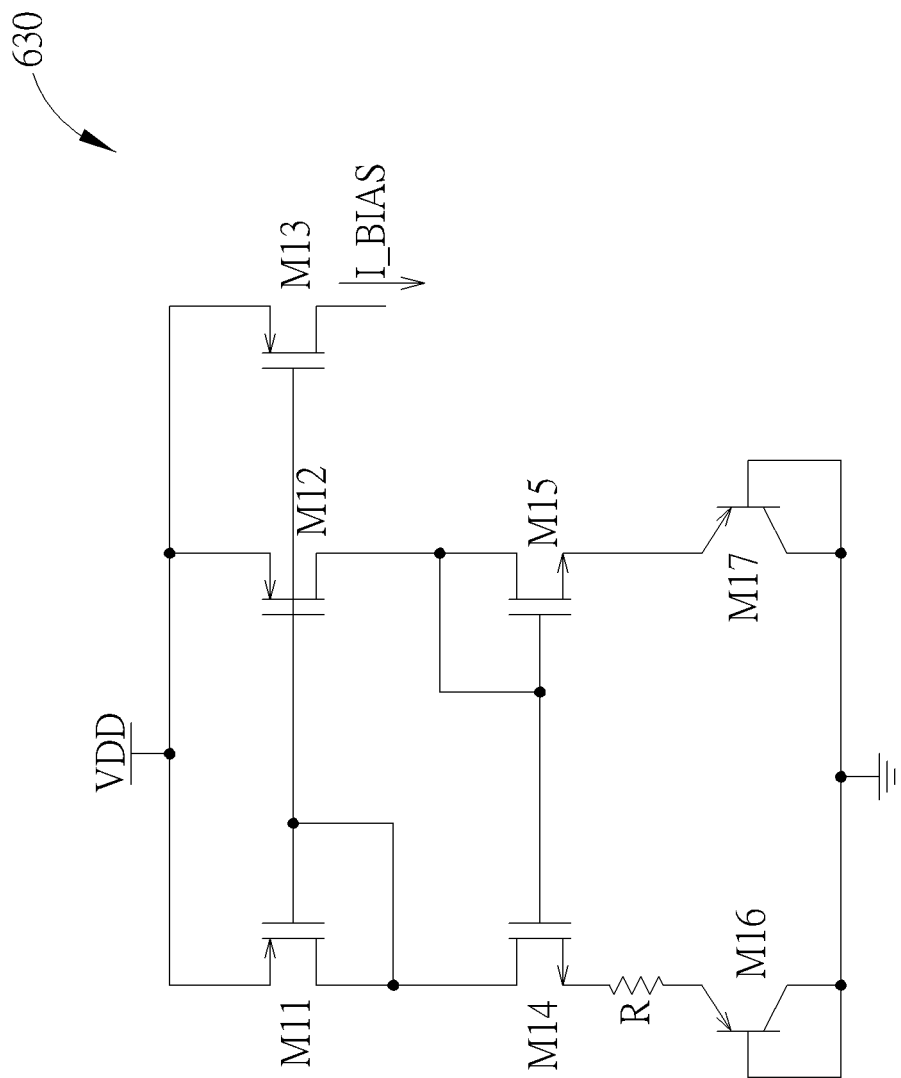
FIG. 7 is a diagram illustrating a current source shown in FIG. 6 according to one embodiment of the present invention.

FIG. 7 is a diagram illustrating the current source 630 according to one embodiment of the present invention. As shown in FIG. 7, the current source 630 is a thermal voltage referenced current source comprising transistors M11, M12, M13, M14, M15, M16 and M17 and a resistor R. In the current source 630, a bias current I_BIAS is proportional to (VT/R), where VT is the thermal voltage.

In this embodiment, the bias current I_BIAS is proportional to (VT/R), the transconductance of the amplifier is proportional to (I_BIAS/VT) if the transistors within the amplifier 610 are in weak inversion regions, the bandwidth of amplifier 610 is proportional to (gm/C), so the bandwidth of amplifier 610 is proportional to (1/R*C) Therefore, by using the RC calibration circuit 620 to adjust the compensation capacitor 614 to make the RC product of the amplifier 610 meet the desired value, the bandwidth of the amplifier 610 can be a constant, and the overdesigns are not needed for the bandwidth.

In this embodiment, in order to save the chip area of the continuous time circuit 600, only the compensation capacitor 614 and the feedback capacitors C_FB1 and C_FB2 are used to fine tune the bandwidth, and the amplifier 610 and the current source 630 do not have any variable resistor for adjusting/determining the bandwidth of the amplifier 610.

It is noted that the current sources 230, 430 and 630 are for illustrative purposely only, and the current sources 230, 430 and 630 may have any other appropriate circuits for generating the bias current I_BIAS. For example, the current source 230 within the continuous time circuit 200 shown in FIG. 2 may be replaced by the current source 430 or 630, the current source 430 within the continuous time circuit 400 shown in FIG. 4 may be replaced by the current source 230 or 630, or the current source 630 within the continuous time circuit 600 shown in FIG. 6 may be replaced by the current source 230 or 430.

Figure 8:
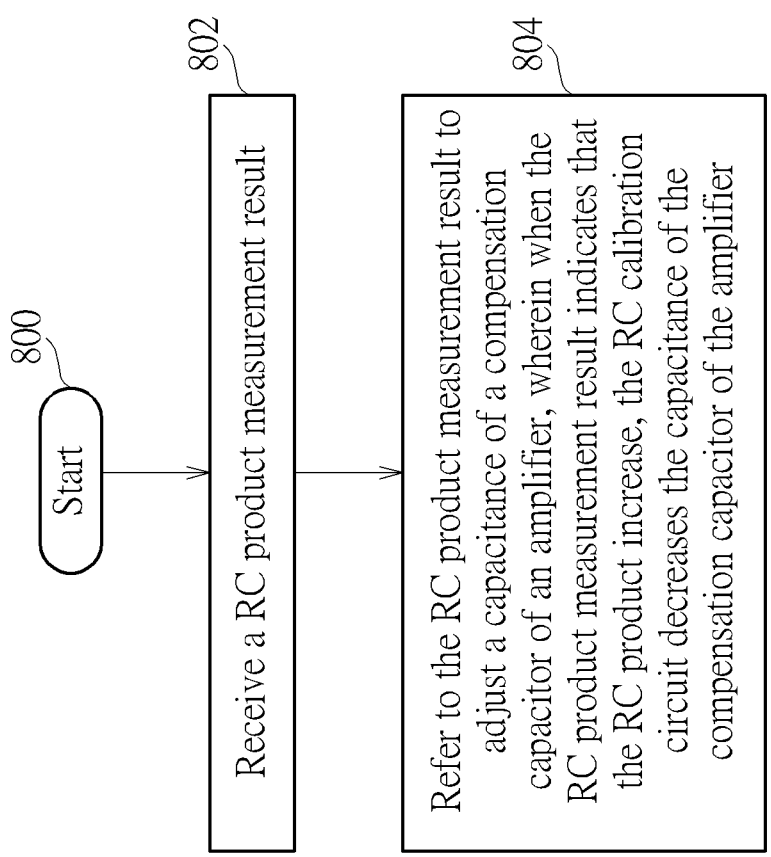
FIG. 8 is a flowchart of a method for calibrating a continuous time circuit according to one embodiment of the present invention.

FIG. 8 is a flowchart of a method for calibrating a continuous time circuit according to one embodiment of the present invention. Refer to FIG. 1-FIG. 7 and above descriptions, the flowchart is described as follows.

Step 800: the flow starts.

Step 802: receive a RC product measurement result.

Step 804: Refer to the RC product measurement result to adjust a capacitance of a compensation capacitor of an amplifier, wherein when the RC product measurement result indicates that the RC product increase, the RC calibration circuit decreases the capacitance of the compensation capacitor of the amplifier.

Briefly summarized, in the continuous time circuit of the present invention, the RC calibration circuit is configured to adjust a compensation capacitor of an amplifier according to a RC product measurement result. By using the compensation method of the present invention, the bandwidth of the amplifier will be more stable even if the amplifier suffers the PVT variations, and overdesigns for the bandwidth are not needed to save the chip area and power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A continuous time circuit, comprising:
   an amplifier, for amplifying an input signal to generate an output signal, wherein the amplifier comprises a compensation capacitor connected to at least one of amplifying stages within the amplifier; and
   a resistance-capacitance (RC) calibration circuit, for receiving a resistance-capacitance (RC) product measurement result, wherein the RC product measurement result indicates if an RC product is less than or greater than a desired value; and the RC calibration circuit further refers to the RC production measurement result to generate a control signal to adjust a capacitance of a compensation capacitor of the amplifier.

2. The continuous time circuit of claim 1, further comprising:
   a current source, for generating a bias current to the amplifier, wherein a resistor within the current source is not adjusted by the RC calibration circuit.

3. The continuous time circuit of claim 2, wherein the bias current generated by the current source is not adjusted by the RC calibration circuit.

4. The continuous time circuit of claim 1, wherein the compensation capacitor is positioned between output terminals of two amplifying stages of the amplifier.

5. The continuous time circuit of claim 1, wherein the compensation capacitor is coupled between an output terminal of the amplifier and a reference voltage.

6. The continuous time circuit of claim 5, wherein the continuous time circuit is a low-dropout regulator (LDO), and the continuous time circuit further comprises:
a transistor, wherein a gate electrode of the transistor is coupled to the output terminal of the amplifier, a drain electrode is coupled to a supply voltage, and a source electrode is coupled to the reference voltage via a resistor.

7. The continuous time circuit of claim 1, wherein the RC calibration circuit further adjusts a capacitance of a feedback capacitor of the amplifier according to the RC product measurement result, wherein the feedback capacitor is coupled between an output terminal and an input terminal of the amplifier.

8. The continuous time circuit of claim 7, wherein the compensation capacitor is positioned between two amplifying stages of the amplifier, and the feedback capacitor is positioned between an input terminal and an output terminal of the amplifier.

9. The continuous time circuit of claim 1, wherein when the RC product measurement result indicates that the RC product increase, the RC calibration circuit decreases the capacitance of the compensation capacitor of the amplifier.

10. A method for calibrating a continuous time circuit, wherein the continuous time circuit comprises an amplifier, the amplifier comprises a compensation capacitor connected to at least one of amplifying stages within the amplifier, and the method comprises:
obtaining a resistance-capacitance (RC) product measurement result, wherein the RC product measurement result indicates if an RC product is less than or greater than a desired value;
referring to the RC production measurement result to generate a control signal to adjust a capacitance of a compensation capacitor of the amplifier.

11. The method of claim 10, further comprising:
providing a current source to generate a bias current to the amplifier; and
not adjusting a resistor within the current source.

12. The method of claim 11, further comprising:
not adjusting the bias current generated by the current source.

13. The method of claim 10, wherein the variable capacitor is positioned between output terminals of two amplifying stages of the amplifier.

14. The method of claim 10, wherein the variable capacitor is coupled between an output terminal of the amplifier and a reference voltage.

15. The method of claim 10, further comprising:
adjusting a capacitance of a feedback capacitor of the amplifier according to the RC product measurement result, wherein the feedback capacitor is coupled between an output terminal and an input terminal of the amplifier.

16. The method of claim 15, wherein the compensation capacitor is positioned between two amplifying stages of the amplifier, and the feedback capacitor is positioned between an input terminal and an output terminal of the amplifier.

17. The method of claim 10, wherein the step of adjusting the capacitance of the compensation capacitor of the amplifier according to the RC product measurement result comprises:
when the RC product measurement result indicates that the RC product increases, decreasing the capacitance of the compensation capacitor of the amplifier.

18. The continuous time circuit of claim 1, wherein if the RC product measurement result indicates that the RC product is greater than the desired value, the RC calibration circuit generates the control signal to lower the capacitance of the compensation capacitor; and if the RC product measurement result indicates that the RC product is less than the desired value, the RC calibration circuit generates the control signal to increase the capacitance of the compensation capacitor.

19. The method of claim 10, wherein the step of referring to the RC production measurement result to generate the control signal to adjust the capacitance of the compensation capacitor of the amplifier comprises:
if the RC product measurement result indicates that the RC product is greater than the desired value, generating the control signal to lower the capacitance of the compensation capacitor; and
if the RC product measurement result indicates that the RC product is less than the desired value, generating the control signal to increase the capacitance of the compensation capacitor.

\* \* \* \* \*